(12) United States Patent
Odendaal

(10) Patent No.: US 6,528,859 B2
(45) Date of Patent: Mar. 4, 2003

(54) FOIL WOUND LOW PROFILE L-C POWER PROCESSOR

(75) Inventor: Willem G. Odendaal, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/853,204

(22) Filed: May 11, 2001

(65) Prior Publication Data

US 2002/0167069 A1 Nov. 14, 2002

(51) Int. Cl.⁷ .............................................. H01L 29/00
(52) U.S. Cl. ...................... 257/531; 257/502; 257/532; 257/277; 324/652; 324/653; 333/184; 333/185
(58) Field of Search ................................ 257/502, 531, 257/532, 277; 324/652, 653; 333/184, 185

(56) References Cited

U.S. PATENT DOCUMENTS

| | | | | |
|---|---|---|---|---|
| 3,579,084 A | * | 5/1971 | Moyer | 321/16 |
| 4,081,770 A | * | 3/1978 | Mayer | 333/79 |
| 5,296,830 A | | 3/1994 | Tamada et al. | 336/192 |
| 5,594,397 A | * | 1/1997 | Uchikoba et al. | 333/202 |
| 5,844,301 A | * | 12/1998 | Van Roosmalen | 257/532 |
| 6,191,676 B1 | * | 2/2001 | Gabor | 336/160 |
| 6,317,965 B1 | * | 11/2001 | Okamoto et al. | 29/602.1 |

FOREIGN PATENT DOCUMENTS

| | | | |
|---|---|---|---|
| DE | 4143120 A1 | * | 7/1992 |
| WO | WO9922565 | | 5/1999 |

* cited by examiner

*Primary Examiner*—Nathan J. Flynn
*Assistant Examiner*—Remmon R. Fordé

(57) ABSTRACT

The present invention provides a foil wound low profile power L-C processor. A magnetic winding is disposed within a core. The magnetic winding can be made of one or more sets of conductive foil and insulation film wound together in a spiral pattern. The magnetic winding can also include dielectric film. The magnetic winding can have a center aperture in which a non-magnetic and non-conductive center post can be disposed. The center post can also be divided into portions with a combined length less than the length of the center aperture to form an air gap within the center aperture.

36 Claims, 7 Drawing Sheets

FOIL WOUND LOW PROFILE L-C POWER PROCESSOR

TECHNICAL FIELD

The technical field of this disclosure is inductor devices, particularly, integrated passive components including foil wound low profile power processors having inductor and capacitor characteristics.

BACKGROUND OF THE INVENTION

There has been an aggressive pursuit after lower profile packages for power electronic circuits and components over recent years. This has lead to unconventional designs both in high and low power applications of switching power electronic circuitry. Although low profile is essential in some applications where flatness of the power supply complements the main product features, it has also found a niche in many other applications as a secondary design objective to improve cost and performance. Other related developments, such as integrated power circuits, modularization, standardization in power electronics, power electronic building blocks and distributed power systems, are fueling the evolution of low profile packaging technologies.

Often misunderstood, however, is that striving for low profile with the current materials and manufacturing technologies involves certain fundamental trade-offs. From a purely electromagnetic perspective, flat power processing components do not utilize materials as well as box-type structures do in general. This means that a flattened structure will require a larger volume and an even more substantial footprint area to perform the same function.

Present pure planar power devices use rectangular foil alternating with rectangular insulating material, arranged in a stack. The insulating material typically has the undesired characteristic of low thermal conductivity accompanying the desired characteristic of low electrical conductivity. The insulating material lies in the primary heat flow path along the direction of the stack and impedes heat transfer. The rectangular shape precludes efficient conductive heat flow along the foil, because the center of the rectangle is too far from any heat sink. These factors can lead to high temperatures in the center of the device.

Low eddy current losses and design flexibility are achievable by using litz-wire, but litz-wire windings suffer from several disadvantages. Besides being expensive and difficult to work with, litz wire also inhibits higher winding packing densities due to the amount of insulation involved. As a result, litz-wound components often run the risk of developing hot-spot temperatures inside the windings.

The size and weight of power conversion devices are governed by the size and weight of the passive components, i.e., capacitors, transformers, and inductors. A greater number of passive components not only increases the size and weight, but also increases the cost and manufacturing complexity.

It would be desirable to have a foil wound low profile L-C power processor that would overcome the above disadvantages.

SUMMARY OF THE INVENTION

One aspect of the present invention provides a foil wound low profile power L-C processor with low profile packaging.

Another aspect of the present invention provides a foil wound low profile power L-C processor operating at a high power density.

Another aspect of the present invention provides a foil wound low profile power L-C processor with superior heat transfer to avoid hot spots.

Another aspect of the present invention provides a foil wound low profile power L-C processor integrating the inductive and capacitive characteristics to reduce the number of passive components.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DESCRIPTION OF THE PREFERRED EMBODIMENT

Figure 1:
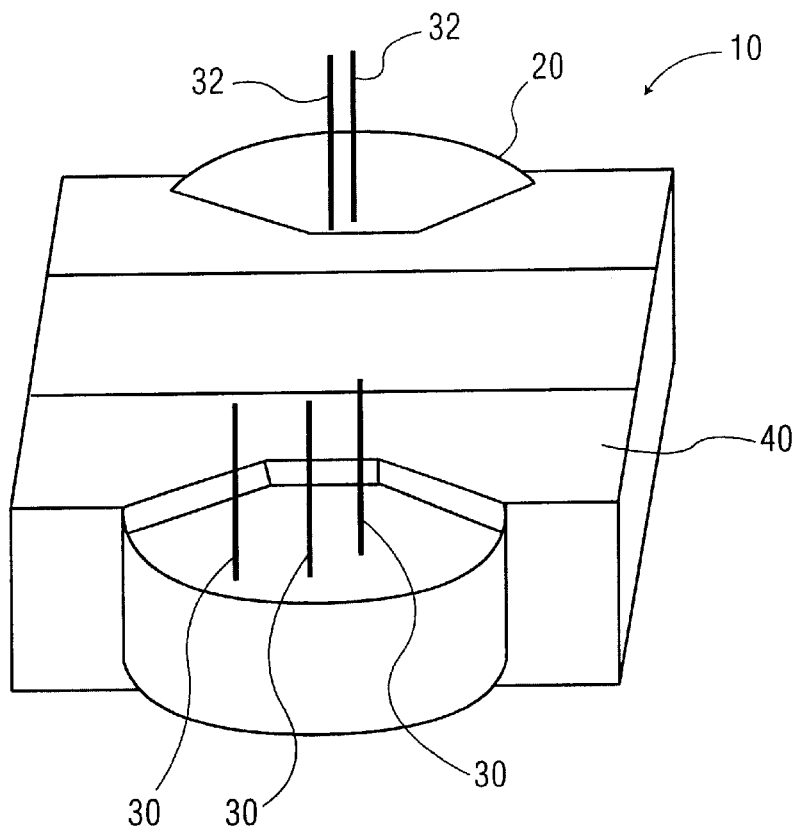
FIG. 1 shows a perspective view of a prototype foil wound low profile power L-C processor made in accordance with the present invention.

FIG. 1 shows a perspective view of a prototype foil wound low profile power L-C processor. The power processor 10 comprises a magnetic winding 20 having first winding terminals 30 and second winding terminals 32 disposed within a core 40. The power processor 10 differs from pure planar power devices by using a short cylindrical magnetic winding 20, rather than an assembly of stacked rectangular foils, and by using a core 40 that houses a cylindrical magnetic winding 20. The power processor 10 is best described as a foil-wound low-profile magnetic component. Although it is not a pure planar power device, power processor 10 maintains the low profile desirable for product design and performance. The use of a cylindrical winding allows much higher material utilization than stacked rectangular devices in terms of power density and energy density.

The power processor shown in FIG. 1 is a prototype device. Further refinements are possible. The low profile lends itself to flat packaging the power processor within a compact shell for mounting. Terminals can be brought out of the package as required for the specific application or to meet standard board layouts. The flat surface can also be provided with fins, a fan, or other cooling features. The flat profile and vertical winding are conducive to transferring heat from the power processor: the heat generated is close to the heat sink and flows vertically along the conductive foil.

Passive integration can be achieved by incorporating the capacitance and inductance of the power processor into the circuit design in which the power processor is used. For example, if the circuit incorporates a resonant tank, the power processor can eliminate the need for a discrete inductor and a discrete capacitor: both the capacitive and inductive elements of a circuit are realized in the power processor itself.

Figure 2:
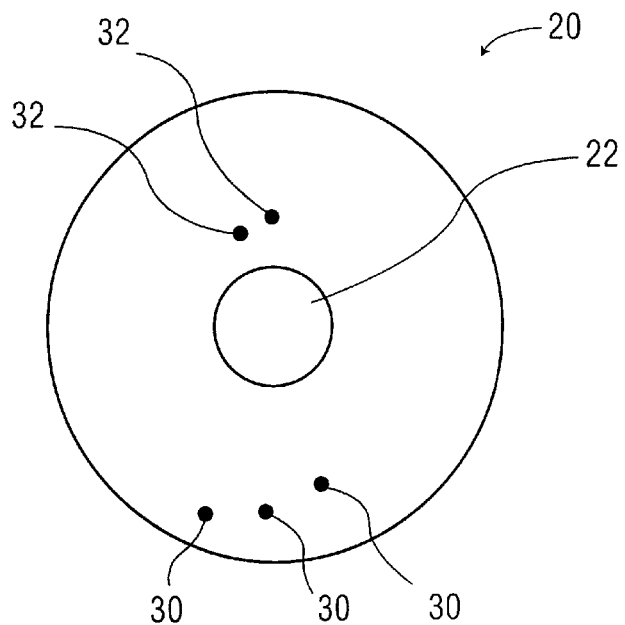
FIG. 2 shows a magnetic winding for a foil wound low profile power L-C processor made in accordance with the present invention.

FIG. 2 illustrates a magnetic winding 20 for a foil wound low profile power L-C processor made in accordance with the present invention.

The magnetic winding 20 can have a center aperture 22 and can be formed of turns of electrically conductive foil with an insulation film. See FIG. 3. The tape winding can be shaped in the forms of short cylinders with the cylindrical diameter larger than its axial thickness, and are also commonly referred to as foil or barrel windings. The mechanical strength and electrical properties of magnetic winding 20 can be enhanced during fabrication with processes such as vacuum impregnation and encapsulation.

The magnetic winding 20 can be any thickness required for the particular application. In one embodiment, the diameter is substantially larger than the axial length, creating a vertical winding. In another embodiment, the windings can have a ratio of the foil winding diameter to the foil winding thickness of greater than or equal to 10:1, which is generally considered the ratio for planar or substantially low profile components. The low profile is desirable for circuit board mounting and heat transfer.

The magnetic winding 20 is provided with first winding terminals 30 and second winding terminals 32. The winding terminals provide the electrical connections between the power processor and outside devices. The winding terminals can be made of any conductive material compatible with the manufacturing process and the surrounding materials, and in various embodiments, can be made of copper, gold, silver, or aluminum. The winding terminals are in electrical contact with individual turns of the tape winding's electrically conductive foil and can be welded or press fit in place. The radial location of the winding terminals is selected to achieve varied operating output characteristics during operation, such as varying voltages. Multiple winding terminals can be used to provide multiple taps and cross connections to provide desired inductance and capacitance as required for a particular application.

Figure 3:
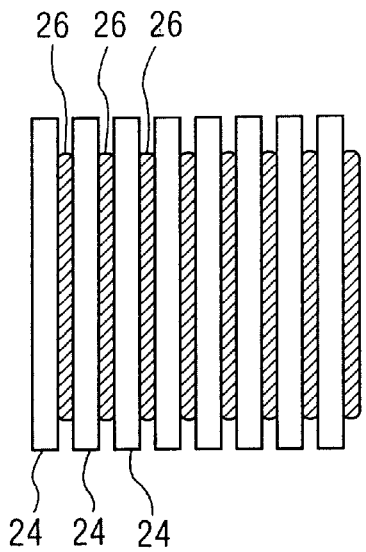
FIG. 3 shows a schematic cross section of the foil windings for a foil wound low profile power L-C processor made in accordance with the present invention.

FIG. 3 shows a schematic cross section of the foil windings for a foil wound low profile power L-C processor. Long strips of electrically conductive foil 26 and insulation film 24 are wound about a common axis to form alternating layers of conductive foil 26 and insulation film 24. In this embodiment, the insulation film 24 acts both as the insulator and the dielectric, filling the space between adjacent conductive turns of the conductive foil 26. Each turn of the conductive foil 26 is insulated from the next turn by the insulation film 24, which is slightly wider than the conductive foil 26. The extra width of the insulation film 24 prevents shorting one turn of the conductive foil 26 to the next, and can be achieved by the initial selection of relative widths between the insulation film 24 and the conductive foil 26, or by etching the magnetic winding 20 to reduce the width of the conductive foil 26 after the magnetic winding 20 is wound.

In one embodiment, the conductive foil 26 can be copper and the insulation film 24 can be a polymer, such as polyethylene terephthalate (PET) film, Mylar® brand polyester film, or nano-structure polymer-ceramic composite film. Polymer dielectric films with relative permittivities of above 5 are readily available for dielectric applications. In other embodiments, the conductive foil 26 can be made of gold, silver, or aluminum, or alloys of copper, gold, silver, or aluminum to improve the workability and strength of the conductive foil 26. Different materials of different thickness can be selected to meet the desired performance and will be well understood by those skilled in the art. The thickness of the conductive foil 26 can be small compared to the skin depth at the design frequency. In an alternate embodiment, several layers of foil can be wound in parallel for each turn of insulation film 24, so that the conductive foil 26 comprises several layers of foil.

In other embodiments, the conductive foil 26 and the insulation film 24 can be of integral construction: the conductive foil 26 can be disposed as a surface layer on the insulation film 24 or the insulation film 24 can be disposed as a surface layer on the conductive foil 26. The surface layer can be applied by thin film deposition, i.e., through evaporation. The integral insulation film 24 disposed on the conductive foil 26 can be metal oxides, metal fluorides, or similar materials.

The magnetic winding 20 can be made of multiple sets of conductive foil and insulation film, forming bi-filar, tri-filar, or n-filar windings, and providing individual units that can be connected or left independent, as required in a particular application. If multiple sets are used, different conductive foil thicknesses, layer combinations, and material can be used for each set. Although the illustrated embodiments show one or two conductive foils wound together to form the magnetic winding 20, as many foils as desired can be wound together to fit a particular application and will be well understood by those skilled in the art. In addition, using various intermediate taps, cross connections between sets, and various end cross connections provides a large number of different configurations suitable for any particular purpose, a few of which are shown for purpose of illustration in FIG. 6A & 6B through FIG. 11A & 11B below.

The orientation of the conductive foil 26 and insulation film 24 in the power processor is suited to efficient heat transfer. Heat flows along the narrow width of the conductive foil to the core, which acts as a heat sink. This avoids high temperatures in the center of the magnetic winding. In pure planar power devices, which have stacks of rectangular foil alternating with insulating material, the insulating material in the heat flow path restricts heat transfer. The insulation film in the power processor of the present invention lies along the direction of heat flow. This provides better heat transfer from the magnetic winding.

Figure 4A:
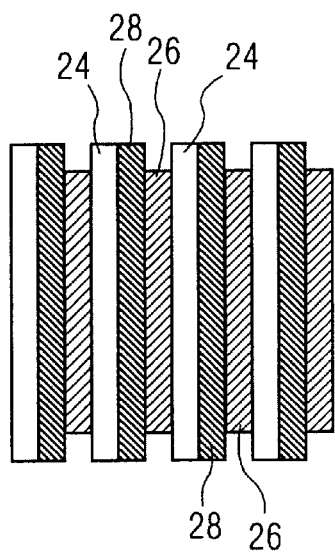
FIGS. 4A & 4B show schematic cross sections of alternate embodiments of the foil windings for a foil wound low profile power L-C processor made in accordance with the present invention.
Figure 4B:
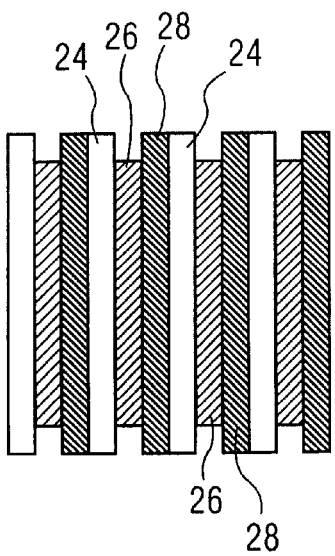

FIGS. 4A & 4B show the schematic cross sections of alternate embodiments of the foil windings for a foil wound low profile power L-C processor. In FIG. 4A, a dielectric film 28 is wound with the alternating layers of conductive foil 26 and insulation film 24. The dielectric film rests on the one side of each turn and occupies all the space between adjacent conductive turns of the conductive foil 26, other than the space that is occupied by the insulation film 24. FIG. 4A shows an embodiment with the dielectric film 28 wound on the other side of the conductive foil 26.

Figure 5:
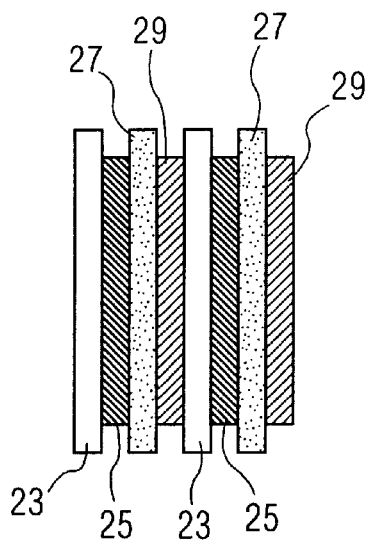
FIG. 5 shows a schematic cross section of an alternate embodiment of the foil windings for a foil wound low profile power L-C processor made in accordance with the present invention.

FIG. 5 shows a schematic cross section of an alternate embodiment of the foil windings for a foil wound low profile power L-C processor. A first conductive foil 25 and first insulation film 23 are wound simultaneously, turn-by-turn, with a second conductive foil 29 and second insulation film 27. This provides opportunities for different terminal impedances, as discussed for FIG. 6B below.

Figure 6A:
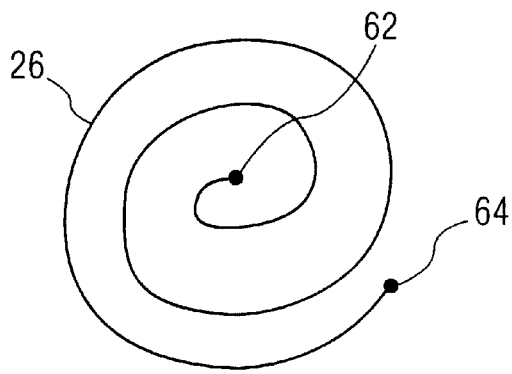
FIGS. 6A & 6B show schematic diagrams of a foil wound low profile power L-C processor made in accordance with the present invention having a single conductive foil and connections at either end of the foil.
Figure 6B:
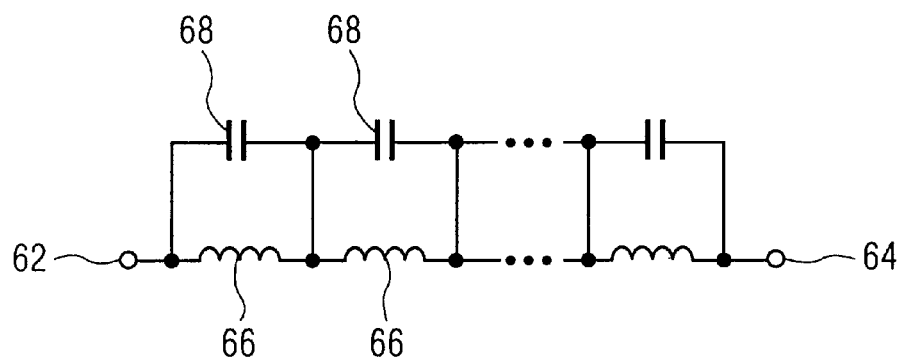

FIGS. 6A & 6B show one embodiment of the invention having a single conductive foil and connections at either end of the foil. FIG. 6A shows a winding as described in FIGS. 3, 4A, and 4B. A single conductive foil 26 is wound with insulation film and/or dielectric film (not shown). Terminals are attached to the conductive foil at the ends at inner connection 62 and outer connection 64. This produces a parallel resonator circuit having a transmission line equivalent circuit of series inductors 66 with parallel capacitors 68, as shown in FIG. 6B.

Figure 7A:
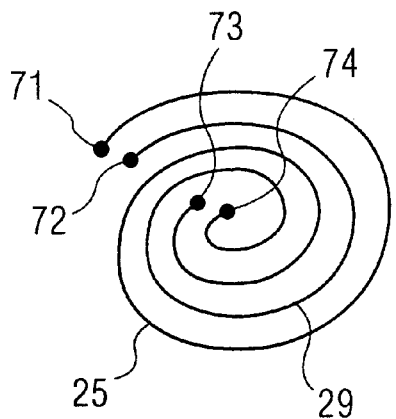
FIGS. 7A & 7B show schematic diagrams of a foil wound low profile power L-C processor made in accordance with the present invention having two conductive foils and connections at either end of the foils.
Figure 7B:
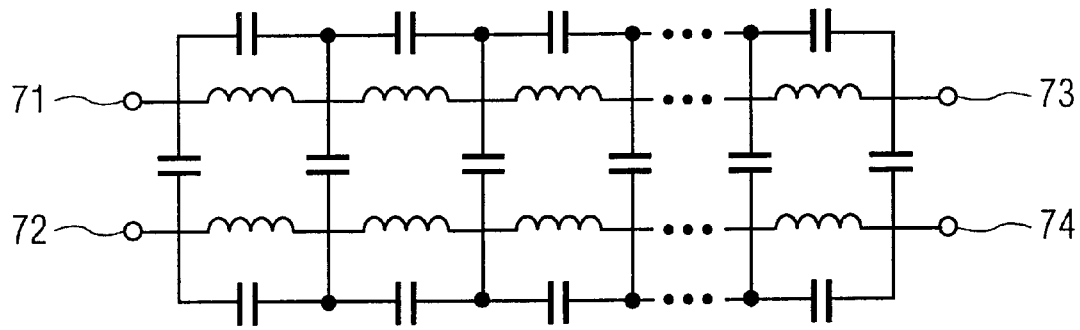

FIGS. 7A & 7B show one embodiment of the invention having a two conductive foils and connections at either end of the foils. FIG. 7A shows a winding as described in FIG. 5, with a first conductive foil 25 and a second conductive foil 29 wound together and separated by insulation film and/or dielectric film (not shown). Four end connections are available: first conductive foil 25 having a first outer connection 71 and a first inner connection 73, and second conductive foil 29 having a second outer connection 72 and a second inner connection 74. The equivalent circuit is shown in FIG. 7B. Various applications are possible by connection and cross connection of the inner and outer connections as discussed below.

Figure 8A:
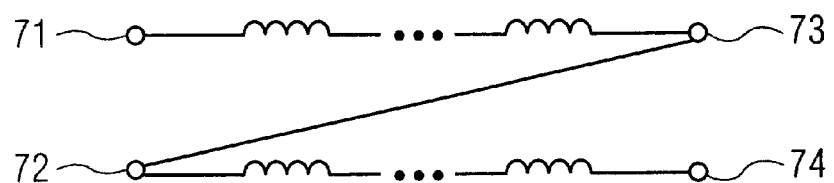
FIGS. 8A & 8B show the bi-filar winding of FIG. 7A wired as a parallel resonator.
Figure 8B:
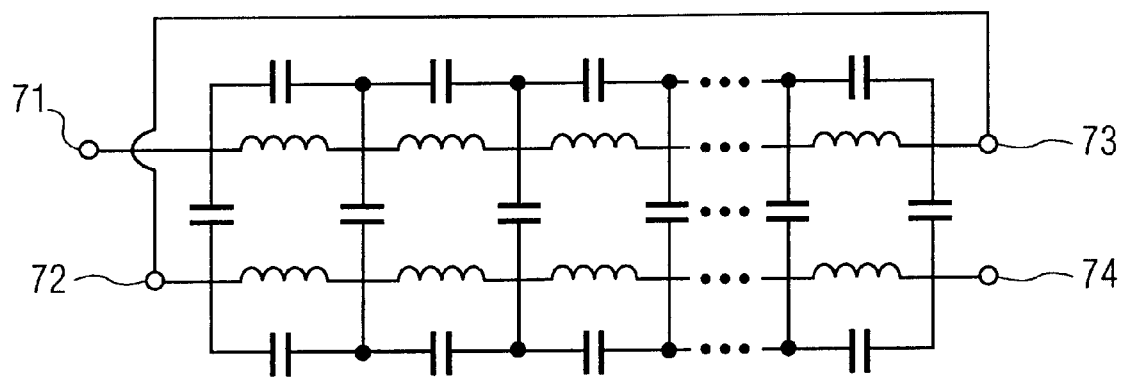

FIGS. 8A & 8B show the bi-filar winding of FIG. 7A wired as a parallel resonator. First inner connection 73 and second outer connection 72 are electrically connected, with connection to exterior circuits provided by first outer connection 71 and second inner connection 74. This produces a parallel resonator circuit having a transmission line equivalent circuit of series inductors with parallel capacitors, as shown in FIG. 8B.

Figure 9A:
FIGS. 9A & 9B show the bi-filar winding of FIG. 7A wired as a series resonator.
Figure 9A:
Figure 9B:
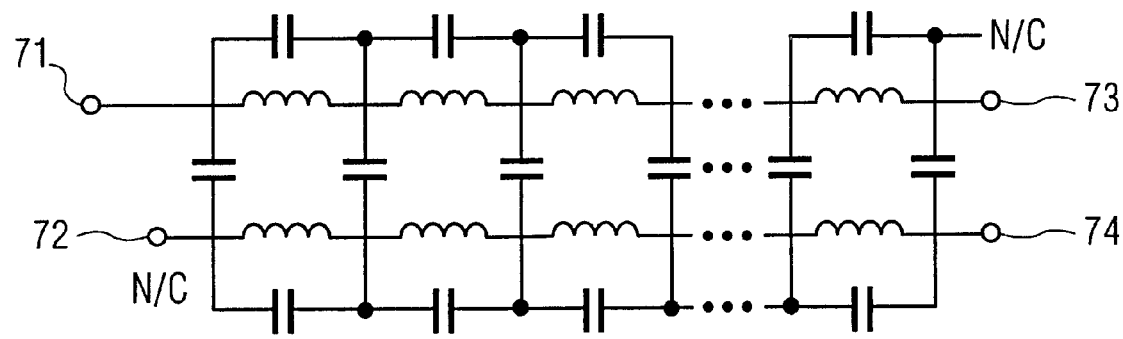

FIGS. 9A & 9B show the bi-filar winding of FIG. 7A wired as a series resonator. First inner connection 73 and second outer connection 72 are not connected. Connection to exterior circuits is provided by first outer connection 71 and second inner connection 74. This produces a series resonator circuit having a transmission line equivalent circuit of inductors and capacitors in series, as shown in FIG. 9B.

Figure 10A:
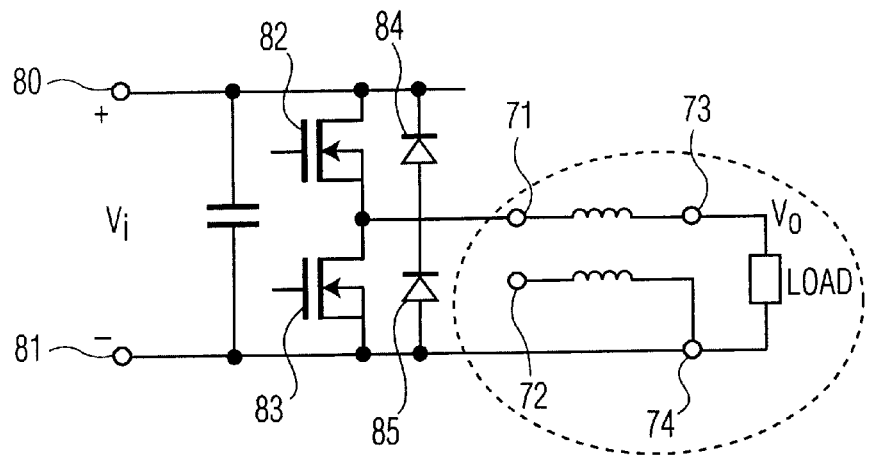
FIGS. 10A & 10B show the bi-filar winding of FIG. 7A used as a parallel-loaded resonant halfbridge.
Figure 10B:
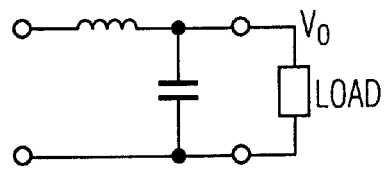

FIGS. 10A & 10B show the bi-filar winding of FIG. 7A used as a parallel-loaded resonant halfbridge. An input voltage is applied across positive terminal 80 and negative terminal 81. By switching first MOSFET 82 and second MOSFET 83, installed across first diode 84 and second diode 85, respectively, a chopped voltage signal is created across second diode 85. First outer connection 71 is connected between first diode 84 and second diode 85. Second outer connection 72 is not connected. Second inner connection 74 is connected to negative terminal 81. The smoothed output voltage is applied to the load between first inner connection 73 and second inner connection 74. The equivalent circuit is shown in FIG. 10B.

Figure 11A:
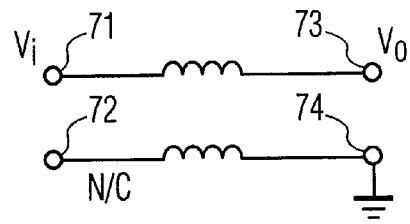
FIGS. 11A & 11B show the bi-filar winding of FIG. 7A used as a low-pass filter.
Figure 11B:
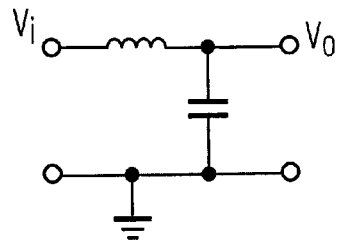

FIGS. 11A & 11B show the bi-filar winding of FIG. 7A used as a low-pass filter. An input voltage is applied at first outer connection 71. Second outer connection 72 is not connected. Second inner connection 74 is grounded and the output voltage is applied to the load between first inner connection 73 and second inner connection 74. The equivalent circuit is shown in FIG. 11B.

It is important to note that FIGS. 10A & 10B and FIGS. 11A & 11B illustrate specific applications and embodiments of the present invention, and are not intended the limit the scope of the present disclosure or claims to that which is presented therein. Upon reading the specification and reviewing the drawings hereof, it will become immediately obvious to those skilled in the art that myriad other embodiments of the present invention are possible, and that such embodiments are contemplated and fall within the scope of the presently claimed invention.

Figure 12:
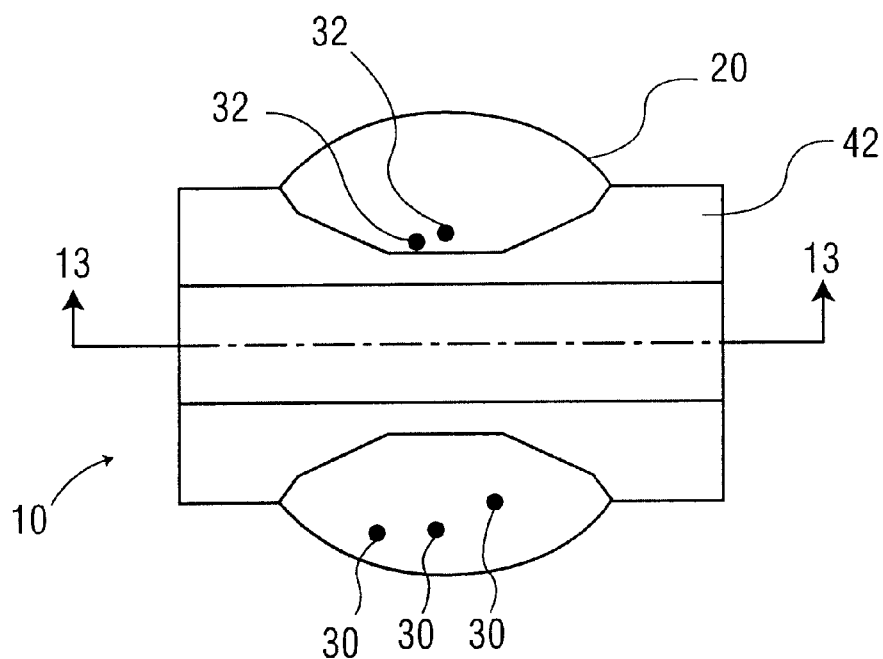
FIG. 12 shows a top view of a foil wound low profile power L-C processor made in accordance with the method of the present invention.

FIG. 12, in which like elements share like reference characters with FIG. 2, shows a top view of a foil wound low profile power L-C processor. First half core 42 and second half core 44 (shown in FIG. 13) enclose the magnetic winding 20 to form power processor 10. The core halves can be made of materials typically used for transformer cores, such as ferrite. The core can be any shape suited to be generally disposed about the magnetic winding 20 and to provide passage for the winding terminals. Viewed along the axis of the magnetic winding 20, the core shape can be rectangular or cruciform with various cutouts for the winding terminals. A center post for disposition within the magnetic winding 20 can be included or omitted. The core geometry can be an substantial alteration of standard configurations, such as PQ, RM, or EQ core designs, flattened to allow for the low profile of the magnetic winding 20 and with different relative dimensions.

Figure 13:
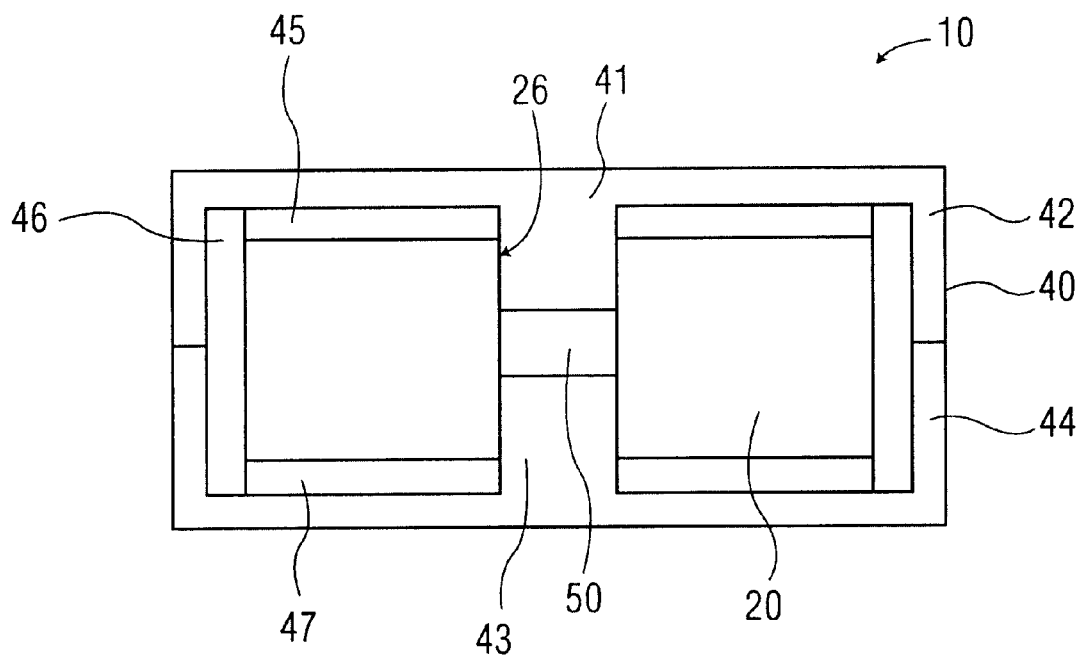
FIG. 13 shows cross-sectional view for a foil wound low profile power L-C processor made in accordance with the present invention.

FIG. 13, in which like elements share like reference characters with FIG. 12, shows cross-sectional view 13—13 from FIG. 12 for a foil wound low profile power L-C processor. Core 40 comprises the first half core 42 and the second half core 44. First center post 41 of the first half core 42 and second center post 43 of the second half core 44 pass through the center aperture 22 of the magnetic winding 20. In one embodiment, the combined length of first center post 41 and second center post 43 is shorter than the thickness of the magnetic winding 20 plus insulators, so an air gap 50 is formed between the center posts in the center aperture 22. The center posts can be made of non-magnetic, non-conductive materials. The air gap 50 and non-magnetic center posts reduce the leakage inductance of the magnetic winding 20.

First insulator 45, edge insulator 46, and second insulator 47 fill the space between magnetic winding 20 and the core. The thicknesses of the first insulator 45, edge insulator 46, and second insulator 47 control the size of integrated leakage inductance, i.e., the fraction of magnetic energy that is stored. The materials for the insulators are selected for high electrical resistance and low thermal resistance. The low thermal resistance of the insulators helps achieve low thermal gradients from the inside to the outside of the power processor, providing high thermal stability. Possible materials for the insulators are air, thermally conductive pads, or resin based potting material.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. A foil wound low profile power L-C processor comprising:
    a magnetic winding;
    at least one first winding terminal electrically connected to the magnetic winding;
    at least one second winding terminal electrically connected to the magnetic winding;
    a core disposed about and operatively coupled to the magnetic winding; and
    an insulator disposed between the magnetic winding and the core.

2. The foil wound low profile power L-C processor of claim 1 wherein the diameter of the magnetic winding is substantially larger than the thickness of the magnetic winding.

3. The foil wound low profile power L-C processor of claim 1 wherein the ratio of the diameter of the magnetic winding to the thickness of the magnetic winding is greater than or equal to 10:1.

4. The foil wound low profile power L-C processor of claim 1 wherein the magnetic winding further comprises conductive foil and insulation film wound in a spiral pattern.

5. The foil wound low profile power L-C processor of claim 4 wherein the conductive foil is selected from the group consisting of copper foil, gold foil, silver foil, aluminum foil, copper alloy foil, gold alloy foil, silver alloy foil, and aluminum alloy foil.

6. The foil wound low profile power L-C processor of claim 4 wherein the conductive foil further comprises layers of foil.

7. The foil wound low profile power L-C processor of claim 4 wherein the insulation film is a polymer film.

8. The foil wound low profile power L-C processor of claim 7 wherein the polymer film is selected from the group consisting of polyethylene terephthalate film, polyester film, and nano-structure polymer-ceramic composite film.

9. The foil wound low profile power L-C processor of claim 4 further comprising a dielectric film wound in a spiral pattern with the conductive foil and the insulation film.

10. The foil wound low profile power L-C processor of claim 4 wherein the insulation film is disposed upon the conductive foil.

11. The foil wound low profile power L-C processor of claim 10 wherein the insulation film is selected from the group consisting of metal oxides and metal fluorides.

12. The foil wound low profile power L-C processor of claim 4 wherein the conductive foil is disposed upon the insulation film.

13. The foil wound low profile power L-C processor of claim 4 wherein the processor is a series resonator.

14. The foil wound low profile power L-C processor of claim 4 wherein the conductive foil further comprises an inner connection and an outer connection, the first winding terminal electrically connected to the inner connection and the second winding terminal electrically connected to the outer connection.

15. The foil wound low profile power L-C processor of claim 4 further comprising an intermediate tap electrically connected to the magnetic winding.

16. The foil wound low profile power L-C processor of claim 1 wherein the magnetic winding further comprises first conductive foil and first insulation film wound simultaneously with second conductive foil and second insulation film, the first conductive foil having a first outer connection and a first inner connection, and the second conductive foil having a second outer connection and a second inner connection.

17. The foil wound low profile power L-C processor of claim 16 wherein the processor is a series resonator.

18. The foil wound low profile power L-C processor of claim 16 wherein the processor is a parallel resonator.

19. The foil wound low profile power L-C processor of claim 16 wherein the first outer connection is electrically connected to the first winding terminal, the first inner connection is electrically connected to the second outer connection, and the second inner connection is electrically connected to the second winding terminal.

20. The foil wound low profile power L-C processor of claim 16 wherein the first outer connection is electrically connected to the first winding terminal, and the second inner connection is electrically connected to the second winding terminal, the first inner connection is not electrically connected, and the second outer connection is not electrically connected.

21. The foil wound low profile power L-C processor of claim 1 wherein the magnetic winding further comprises a set of conductive foil and insulation film, the set wound simultaneously with a plurality of other sets of conductive foil and insulation film.

22. The foil wound low profile power L-C processor of claim 1 wherein the magnetic winding forms a center aperture along the axis of the magnetic winding.

23. The foil wound low profile power L-C processor of claim 22 wherein the center aperture has a substantially circular cross section.

24. The foil wound low profile power L-C processor of claim 22 wherein the core further comprises a center post disposed within the center aperture of the magnetic winding.

25. The foil wound low profile power L-C processor of claim 24 wherein the center post is non-magnetic and non-conductive.

26. The foil wound low profile power L-C processor of claim 24 wherein the center post further comprises a first center post and a second center post.

27. The foil wound low profile power L-C processor of claim 26 wherein the combined length of the first center post and the second center post is less than the length of the center aperture so that an air gap is formed between the first center post and the second center post within the center aperture.

28. The foil wound low profile power L-C processor of claim 1 wherein insulators are disposed between the magnetic winding and the core.

29. The foil wound low profile power L-C processor of claim 1 wherein the magnetic winding has a first side, a second side, and an edge; the insulator comprises a first insulator, a second insulator, and an edge insulator; and the first insulator is disposed on the first side, the second insulator is disposed on the second side, and the edge insulator is disposed on the edge.

30. A system for manufacturing a foil wound low profile power L-C processor comprising:
    means for forming a magnetic winding by winding conductive foil and insulation film in a spiral pattern;
    means for electrically connecting at least one first winding terminal to the magnetic winding;

means for electrically connecting at least one second winding terminal to the magnetic winding;

means for disposing the magnetic winding within an insulator; and means for disposing the insulator within a core.

31. A foil wound low profile power L-C processor comprising:

a magnetic winding having a center aperture;

at least one first winding terminal electrically connected to the magnetic winding;

at least one second winding terminal electrically connected to the magnetic winding; and a core comprising a first half core having a first center post and a second half core having a second center post, wherein the first half core and the second half core are disposed on opposite sides of and operatively coupled to the magnetic winding, and the first center post and the second center post are disposed in the center aperture.

32. The foil wound low profile power L-C processor of claim 31, wherein the first center post and the second center post are non-magnetic and non-conductive.

33. The foil wound low profile power L-C processor of claim 31 wherein the combined length of the first center post and the second center post is less than the length of the center aperture so that an air gap is formed between the first center post and the second center post within the center aperture.

34. The foil wound low profile power L-C processor of claim 31 further comprising a first insulator electrically isolating the first half core from the magnetic winding, a second insulator electrically isolating the second half core from the magnetic winding, and an edge insulator electrically isolating the first half core and the second half core from the magnetic winding.

35. The foil wound low profile power L-C processor of claim 31 further comprising a first insulator and a second insulator; wherein the first insulator is disposed between the first half core and the magnetic winding and the second insulator is disposed between the second half core and the magnetic winding.

36. A foil wound low profile power L-C processor comprising:

a magnetic winding having a center aperture;

a plurality of first winding terminals electrically connected to the magnetic winding;

a plurality of second winding terminals electrically connected to the magnetic winding;

a first half core having a first center post, the first half core disposed about the magnetic winding with the first center post disposed in the center aperture;

a second half core having a second center post, the second half core disposed about the magnetic winding with the second center post disposed in the center aperture;

a first insulator disposed between the first half core and the magnetic winding;

a second insulator disposed between the second half core and the magnetic winding; and an edge insulator, the edge insulator disposed between the first half core and the edge of the magnetic winding, the edge insulator further disposed between the second half core and the edge of the magnetic winding;

wherein the first center post and the second center post form an air gap in the center aperture.

* * * * *